United States Patent [19]

Takeda et al.

[11] Patent Number: 4,992,760
[45] Date of Patent: Feb. 12, 1991

[54] MAGNETOSTATIC WAVE DEVICE AND CHIP THEREFOR

[75] Inventors: Shigeru Takeda, Kumagaya; Kohei Ito, Fukaya; Yasuaki Kinoshita, Hachioji; Sadami Kubota, Tottori, all of Japan

[73] Assignees: Hitachi Metals, Ltd.; Hitachi, Ltd.; Hitachi Ferrite, Ltd., all of Tokyo, Japan

[21] Appl. No.: 274,246

[22] Filed: Nov. 21, 1988

[30] Foreign Application Priority Data

Nov. 27, 1987 [JP] Japan ............................. 62-297480

[51] Int. Cl.⁵ .............................................. H01P 7/00
[52] U.S. Cl. .................... 333/219.2; 333/202; 333/219; 333/246
[58] Field of Search ............... 333/202, 204, 205, 219, 333/219.1, 219.2, 141–145, 147–149, 151–153, 24.1

[56] References Cited

U.S. PATENT DOCUMENTS

| | | | |
|---|---|---|---|
| 4,318,061 | 3/1982 | Castéra et al. | 333/151 X |
| 4,419,637 | 12/1983 | Volluet et al. | 333/147 |
| 4,472,692 | 9/1984 | Hartemann et al. | 333/147 |
| 4,547,754 | 10/1985 | Murakami et al. | 333/219 |
| 4,743,874 | 5/1988 | Kinoshita et al. | 333/219 |

OTHER PUBLICATIONS

"Flat, Simple-to-Handle YIG Resonator is a Snap to Orient in an Oscillator", Electronics, vol. 51, No. 9, Apr. 27, 1978, pp. 70, 72.

Carter et al. "Ion-Inplanted Magnetostatic Wave Reflective Array Filters", Journal of Applied Physics. 53(3), Mar. 1982; pp. 2655–2657.

Chang et al., "The Effect of Width Modes on the Performance of MSSW Resonators", IEEE Ultrasonics Symposium, 1984, pp. 164–167.

Ikuzawa et al., "Resonant Modes of Magnetostatic Waves in a Normally Magnetized Disk", J. of Appl. Physics, vol. 48, Jul. 1977, pp. 3001–3007.

Primary Examiner—Eugene R. LaRoche
Assistant Examiner—Seung Ham
Attorney, Agent, or Firm—Finnegan, Henderson, Farabow, Garrett & Dunner

[57] ABSTRACT

A chip for a magnetostatic wave device comprising; a base substrate consisting of a dielectric monocrystalline base plate and a ferrimagnetic monocrystalline film formed on the base plate; an excitation means for magnetostatic waves formed on the ferrimagnetic film when it is given a bias magnetic field and high frequency electric signals; and a reflection means to reflect the excited magnetostatic wave toward the center portion of the film before it reaches at end portions of the ferrimagnetic film.

13 Claims, 9 Drawing Sheets

MAGNETOSTATIC WAVE DEVICE AND CHIP THEREFOR

BACKGROUND OF THE INVENTION

1. Field of the Invention

This invention relates to a magnetostatic device utilizing ferromagnetic resonance of YIG(Yttrium-Iron-Garnet) which has frequency-variable characteristics for a wide frequency range and a chip therefor. It comprises a YIG film deposited on a basic plate of GGG(Gadolinium-Gallium-Garnet), on which other components are formed by a photo-lithograpy technology. More specifically, the invention relates to a magnetostatic resonator and a chip therefor which can be incorporated in a relatively small metallic package.

2. Description of the Prior Art

A magnetostatic wave device utilizing ferromagnetic resonance typically is used in a delay line, a filter in a radar system or a communication system for microwave.

Figure 15A:
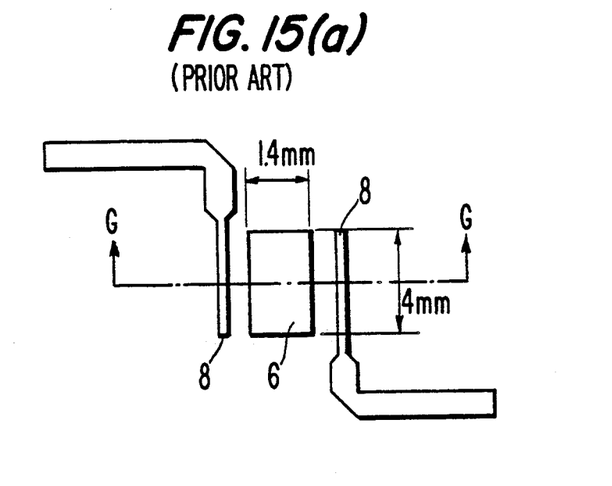
FIG. 15(a) and FIG. 15(b) are respectively a plane view of a conventional magnetostatic wave device and its G—G cut cross-sectional view.
Figure 15B:
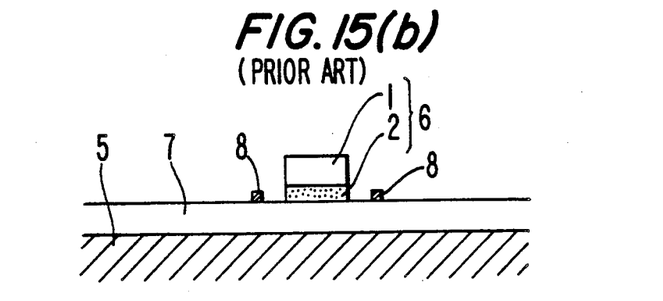

FIG. 15(a) and FIG. 15(b) illustrate the structure of a conventional magnetostatic wave resonator described in IEEE Ultrasonic symposium, 1984, pp 164–167. FIG. 15 (b) is a G—G cross-sectional view of the device shown in FIG. 15(a). The magnetostatic wave device includes a chip 6 of YIG 2/GGG 1 having a size of 4 mm×1.4 mm and coupling lines 8 on a dielectric substrate 7 located on a ground 5. It resonates at a frequency of about 12 GHz. A bias magnetic field $H_0$ is applied perpendicular to the surface of YIG film 2 in the chip 6.

One of the coupling lines 8 is an input terminal and the another is an output terminal on the chip 6. When the input terminal is connected to a high frequency power source, a magnetostatic wave occurs in the YIG film 2 and the magnetostatic wave can be detected at the output terminal which is spaced a predetermined distance from the input terminal.

The resonance frequency of the magnetostatic wave depends on the shape of the chip 6 and the bias magnetic field $H_0$.

A resonance frequency can be obtained by adjusting the bias magnetic field $H_0$ to pass only a desired frequency of signal to the output terminal from the input terminal.

But the conventional magnetostatic wave device shown in FIG. 15 is inferior in that it is difficult to incorporate in a compact package, primarily because the electrodes 8 used to exite the magnetostatic wave are not arrayed on nor integrated with the chip.

There is also the problem that it is difficult to locate the chip 6 and the electrodes 8 exactly at the desired positions, and it is necessary to take precautions to maintain exactly the width of YIG film 2 of the chip 6 and to polish precisely the end surface of the chip, to establish a high Q-value of resonance in the device.

Figure 16:
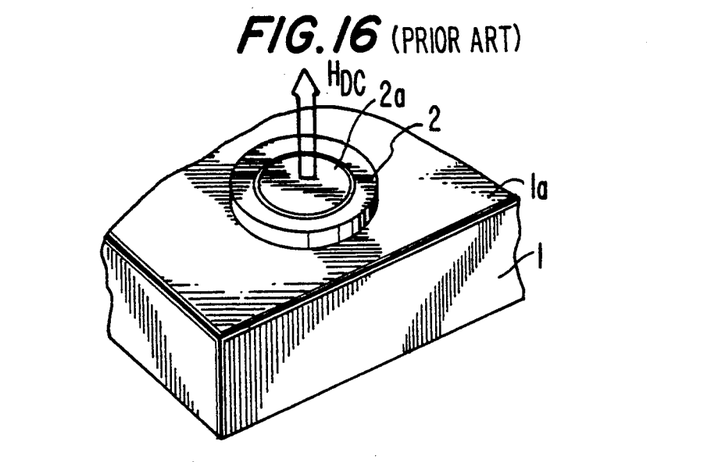
FIG. 16 is a perspective view of a prior magnetostatic wave device.

Murakami et al. disclose another type of ferromagnetic resonator as shown in FIG. 16 in their U.S. Pat. No. 4,547,754. In that resonator, higher frequencies of parasitic modes are reduced by a circular ditch or groove formed in a YIG film or a disk shaped thinner portion formed in the YIG film.

Murakami et al. mention the problem that undesirable modes of magnetostatic resonances are caused by the peripheral area extending inwardly about 1 mm or less from the end of YIG film where a demagnetization field increases drastically up to the end the YIG film, which demagnetization field causes a drastic variation in the inside magnetic field Hi as indicated in FIG. 2 of Murakami et al, even if the YIG film is located in a uniform magnetic field.

Each mode of resonances is described as $(n, N)_m$ 7, when a magnetic field is applied perpendicular to the surface of a ferrimagnetic material of film, as analized in Journal of Applied Physics, Vol. 48, July 1977, pp. 3001–3007. A $(n,N)_m$ mode means a mode having n joints along the peripheral direction, N joints along a diameter direction and $(m-1)$ joints along the thickness direction of the YIG film.

For example, the $(1,1)_1$ mode is the main mode of magnetostatic resonances, if a wholly uniform magnetic field exists in the YIG film.

When the main mode identified as $(1,1)$ is utilized in, for example, a bandpass filter or other devices, other modes are parasitic modes of higher harmonic frequencies in the device.

Although Murakami et al. present improvements to suppress undesirable modes of resonances, they are inferior in the following points.

It is difficult to remove accurately only a partial thickness of a very thin YIG film by a chemical etching process, and the steps used in the etching process on the YIG film surface damages transducers which are directly formed on the chip.

The object of the present invention is to provide a compact shaped magnetostatic wave device including a YIG/GGG chip having precise dimensions which is incorporated with transducers located precisely at desired positions to further suppress undesired higher harmonic frequencies of subsidiary or parasitic waves.

SUMMARY OF THE INVENTION

A chip for a magnetostatic wave device according to the present invention comprises a chip provided with a ferrimagnetic single crystal film formed on a dielectric single crystal of substrate, resonance means for generating a magnetostatic wave formed at about the center of the ferrimagnetic single crystal film, reflection means for reflecting a resonant wave produced by the resonance means back to the center portion before it reaches the ends of the ferrimagnetic film.

It is possible to reduce higher harmonic modes of parasitic waves caused by the non-uniformity of the magnetic field at the periphery of the ferrimagnetic film, by reflecting to the center portion the waves before they reach the end portions of the ferrimagnetic film.

The reflection means for the resonance wave can be an electrically conductive film laminated on the peripheral area of the ferrimagnetic film. For example the reflection conductor can be a flat, shaped conductor, the center portion of which is selectively removed to form a peripheral portion which conductor continuous or can be discontinuous and a center conductor portion which, together, exite the waves. The cut peripheral portion and the center conductor portion can be formed exactly as desired by a photoetching or chemical etching process, because these forming methods can provide an excellent working accuracy depending on the working accuracy of the mask to be used.

It is also possible to use a magnetically different film material as the peripheral conductor portion to reflect the waves.

It is sufficient the peripheral film has different magnetic characteristics in terms of the coercive force from the ferrimagnetic film.

This case is different from the former case in that an arbitrariness for design is expanded, because the boundary condition for the high frequency of signal is designed independently from the boundary condition for the reflection of the wave.

These chip structures are easy to be made to form a high Q-value of resonator, because they do not require a process to remove a partial thickness of YIG film by chemical etching.

It is also possible to make a relatively small sized magnetostatic wave device using a small permanent magnet located close to the chip almost contacting it in order to produce a bias magnetic field, according to the present invention.

The magnetostatic wave device can be made small, also, because transducers to exite the magnetostatic wave can be formed on the chip, by forming one or more of the center conductors portions to pass a high frequency current around the center of the ferrimagnetic film.

The magnetic circuit to apply a bias magnetic field can be constructed with at least one permanent magnet, and preferably together with a magnetic part for regulation.

BRIEF DESCRIPTION OF THE DRAWINGS

FIG. 11, FIG. 12(a), FIG. 12(c) and FIG. 13 are respectively plane views of YIG/GGG type of chips for magnetostatic wave devices according to the invention;

DESCRIPTION OF THE PREFERRED EMBODIMENT

The followings are explanations of examples of the invention.

EXAMPLE 1

Figures 1A, 1B:
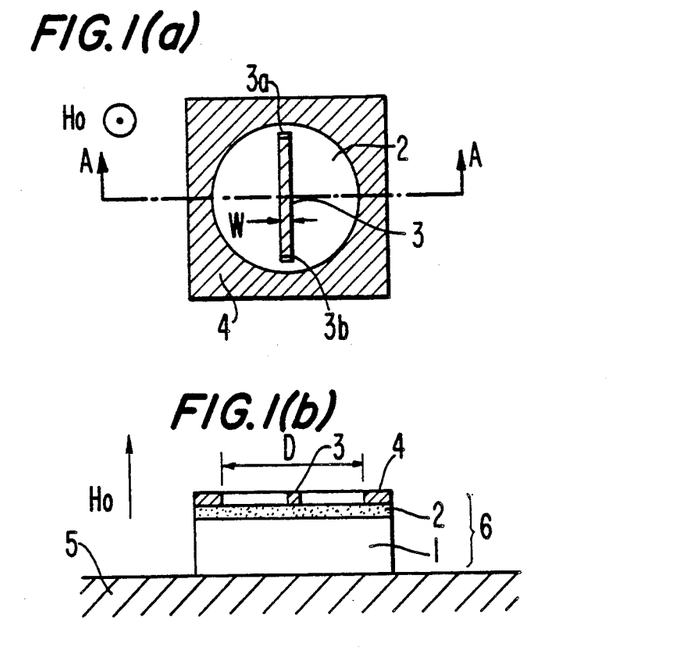
FIG. 1(a) and FIG. 1(b) are respectively a plane view and a A—A cut cross-sectional view of a chip for a magnetostatic wave device incorporated with a peripheral conductor 4 to reflect magnetostatic waves according to the invention.
Figure 2:
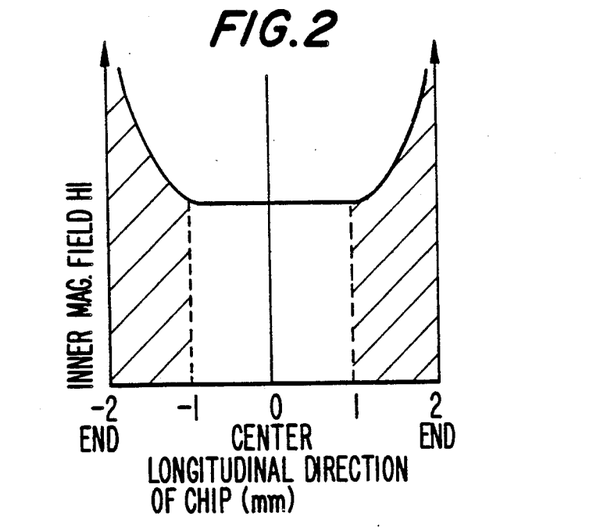
FIG. 2 is a graph showing the dependency of the intensity of inner magnetic field in a YIG chip along its longitudinal direction.

FIG. 1(a) and FIG. 1(b) are respectively a plan view and the A—A cut cross-sectional view of a chip 6 and a ground 5 to be incorporated in a magnetostatic wave device according to the invention.

The chip 6 for magnetostatic wave device as shown in FIG. 1(a) and FIG. 1(b) is produced by the following steps:

(a) forming a YIG film 2 having a 20 $\mu$m thickness on a GGG base substrate 1 by an epitaxial method; and (b) forming simultaneously a center conductor portion 3 of Al film and a peripheral conductor portion 4 to reflect magnetostatic waves on the YIG film 2 by a photoetching process.

The produced chip 6 for magnetostatic wave device has a square shape of dimensions of 5 mm×5 mm.

The center conductor 3 located about at the center of the chip 6 has a width(w) of 30 $\mu$m and the peripheral conductor of Al film has a 3 mm inner diameter.

Figure 3A:
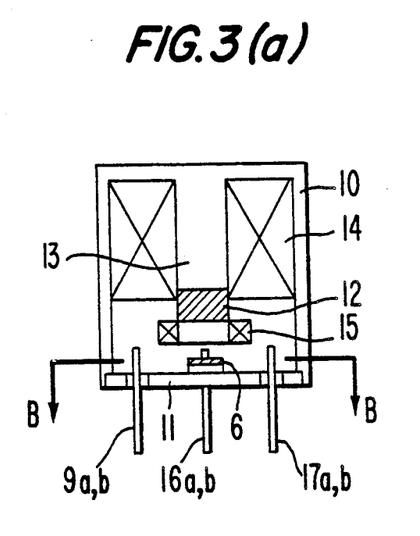
FIG. 3(a) and FIG. 3(b) are respectively a longitudinally cut cross-sectional view and its B—B cut cross-sectional view of a chip for a magnetostatic wave device according to the invention.
Figure 3B:
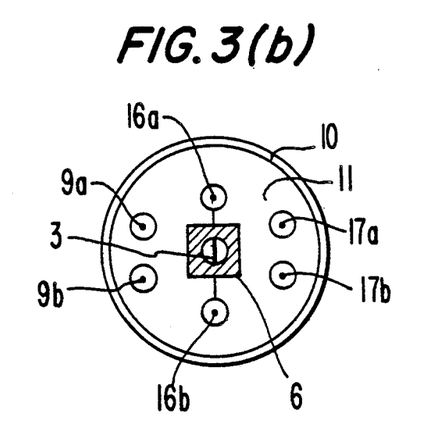

FIG. 3(a) is a longitudinally cut cross-sectional view of a magnetostatic wave device incorporated with the chip invention as shown in FIG. 1. FIG. 3(b) is the B—B cut cross-sectional view of the device of FIG. 3(a).

The magnetostatic wave device comprises the chip 6, a permanent magnet 12 to provide a bias magnetic field $H_0$ applied to the chip, a driving coil 14 for rough tuning connected with terminals 9a and 9b, a driving coil 15 for fine tuning connected with terminals 17a and 17b, a base plate 11 to provide a ground, a cap 10, a pole piece 13 and input/output terminals 16a and 16b for microwave signals which are electrically connected with the center conductor 3.

The resonance frequency is variable in the magnetostatic wave device, by changing the current flow in each of moving coils 14 and/or 15.

To evaluate the characteristics of the magnetostatic wave device, the scattering parameter $S_{21}$ was measured under the condition that the terminal 3a and the peripheral conductor 4 are input terminals and the terminal 3b and the peripheral conductor 4 are output terminals while the chip 6 is located on the ground 5 in a magnetic field $H_0$ of 2600 Oe as shown in FIG. 1(b).

The numerals 1 and 2 of the scattering parameter $S_{21}$ show respectively an input terminal and an output terminal.

Figure 4A:
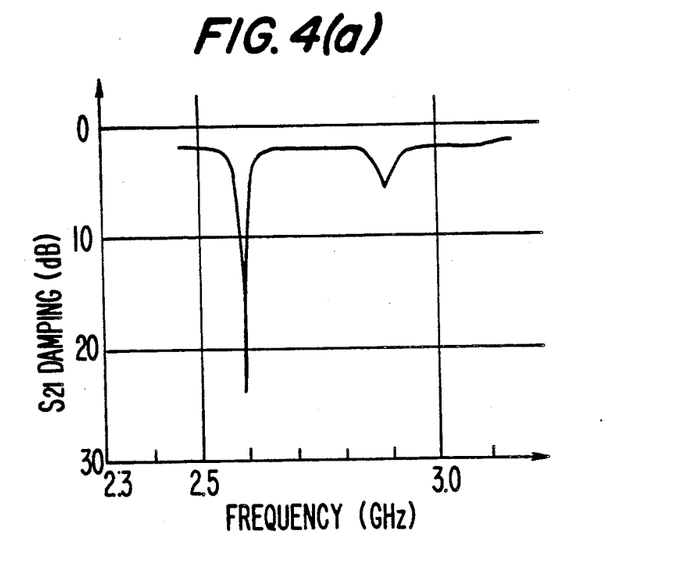
FIG. 4(a) is a graph to show a frequency dependency of resonance characteristics in the chip for a magnetostatic wave device of FIG. 1.

FIG. 4(a) shows the results of the measurement for the device according to the invention.

For comparison the scattering parameter $S_{21}$ was measured for a comparative device in which peripheral conductor 4 was not formed, while the terminal 3a and the ground 5 are input terminals and the terminal 3b and the ground 4 are output terminals.

Figure 4B:
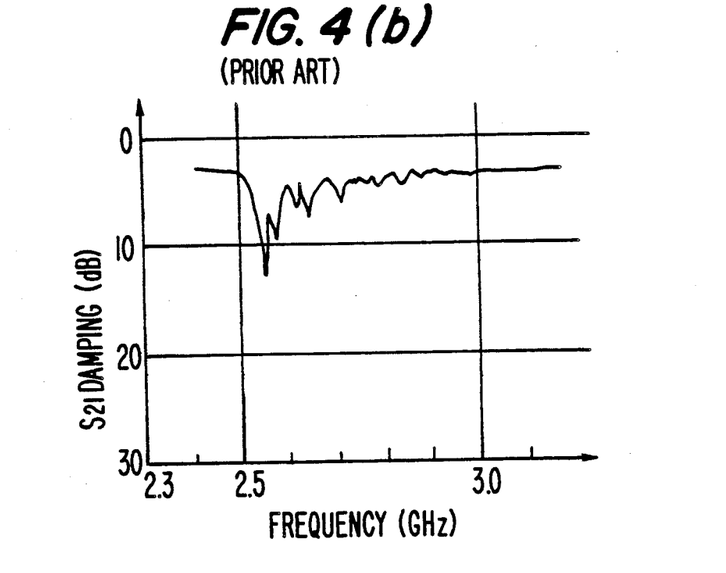
FIG. 4(b) is a graph to show a frequency dependency of resonance characteristics in a conventional chip for magnetostatic wave device.

The results of the measurement of $S_{21}$ in the later case is shown in FIG. 4(b).

As shown in FIG. 4(a), a sharp peak at the main resonance $f_R$ of 2.60 Hz was observed and the load $Q_L$ was equal to 1000.

Another resonance was observed around at a frequency of about 2.95 GHz which corresponds t a higher mode, but the height is significantly less than the height of the main peak.

On the other hand the device for comparison has many higher modes of resonances and also a rather low $Q_L$-value of about 200, although the main resonance frequency is observed at about the same frequency as the resonance in the above mentioned example of the invention. As is apparent from the comparison of the example of the invention and the device for comparison, an extremely high Q-value of device can be produced according to the invention.

Similar resonance characteristics can be observed when a scattering parameter $S_{11}$ is measured under the condition that the terminal 3b and the ground 5 are used as a terminal 1, and the terminal 3a and the ground 5 are used as another terminal 2. In this case, the main resonance frequency changes to 2.90 GHz when the magnetic field $H_0$ is changed to 2670 Oe.

When the terminal 3b and the ground 5 are open, the response in resonance is strengthened in a relation with the impedance characteristic in the measuring system.

EXAMPLE 2

Figure 5A:
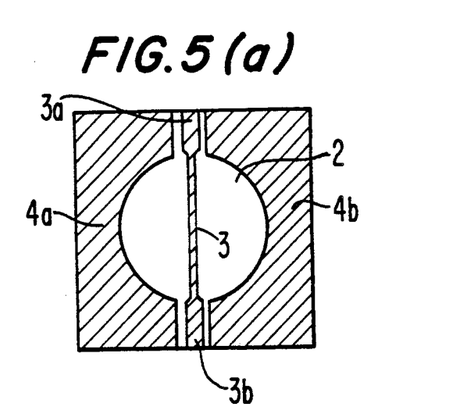
FIG. 5(a), FIG. 5(b), FIG. 6 and FIG. 7(a) and FIG. 7(b) are respectively plane views of examples of chip according to the invention.
Figure 5B:
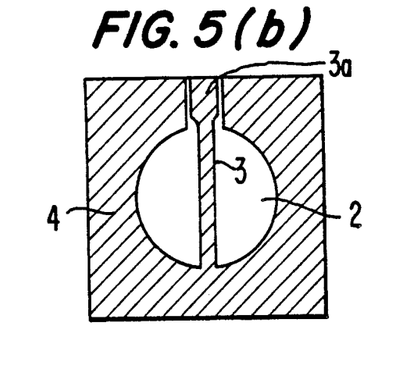

Other examples of chips for magnetostatic wave devices having an electrically conductive part to reflect the wave as in the Example 1 according to the invention are shown in FIG. 5(a) and FIG. 5(b).

In FIG. 5(a), the peripheral conductor 4 is divided into two parts and each of the terminals 3a and 3b of the central conductor 3 extends to the radially opposite ends of the chip 6. This structure makes it easy to connect the chip 6 and the input/output terminals.

FIG. 5(b) shows another example where one end of terminals of a central conductor is integrated with peripheral conductor 4. This structure also reduces undesirable effects caused by the end portions of the chip 6.

Figure 6:
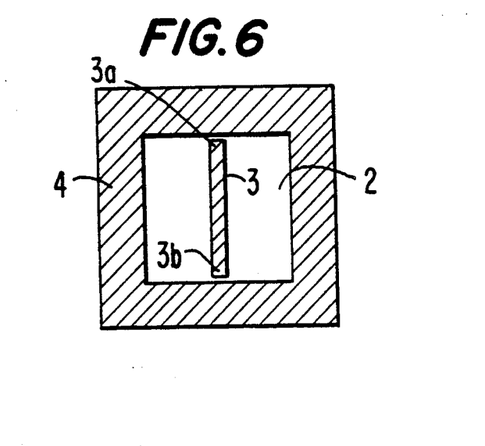

The peripheral conductor 4 can have other high symmetry shapes, such as the square shape as shown in FIG. 6, which provides the same effect of preventing undesirable effects by the end portions of the chip.

Figure 7A:
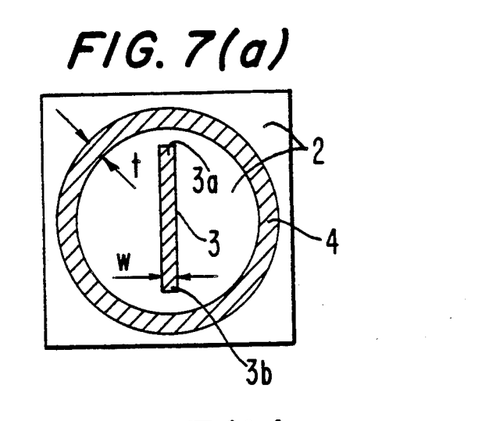
Figure 7B:
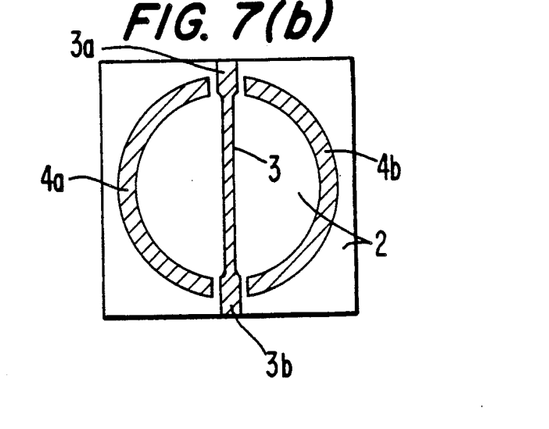

The peripheral conductor also can be a ring as shown in FIG. 7(a) or FIG. 7(b), which only defines an edge of the chip 6. In this case, the width(t) of the ring is preferably wider than the width(w) of the center conductor 3, because a too narrow width of peripheral conductor might not be sufficient to reflect magnetostatic waves.

The center conductor 3 and the peripheral conductor can be the same material of high electrical conductivity as Al, Au and others. The peripheral conductor also can be a different material from the center conductor. In these examples the substrate is a GGG single crystal, but other crystals as a $Gd_{3-x}Y_xGaO_{12}$ can be used as a base substrate on which a YIG film is formed.

Other ferrimagnetic material such as a Bi substituted YIG, a Ca substituted YIG, a Ga substituted YIG can be used instead of ordinary YIG. These modifications can be performed according to the present invention.

EXAMPLE 3

Figures 8A, 8B:
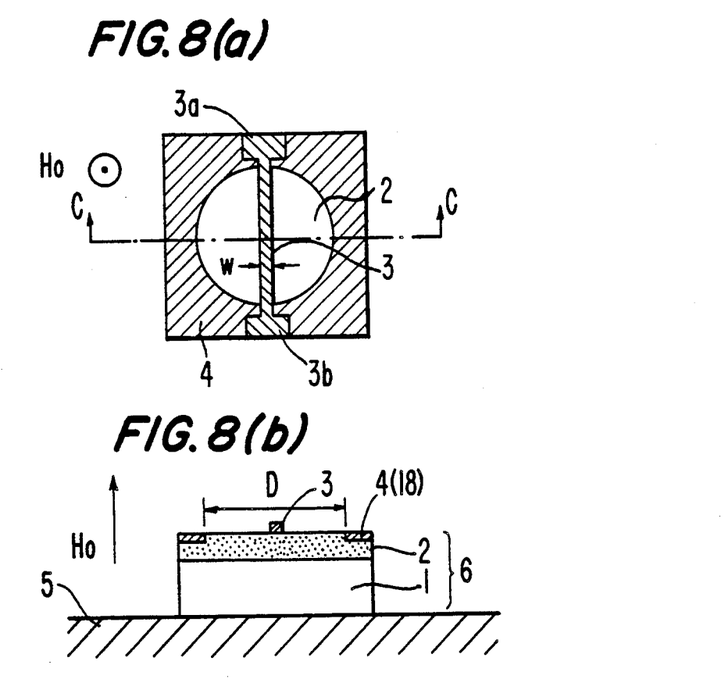
FIG. 8(a) and FIG. 8(b) are respectively plane views of a chip and the C—C cut cross-sectional view of the chip incorporated with a Ti-diffused layer 4 as a reflection means on the YIG film.

Another example of the invention is shown in FIG. 8(a) and FIG. 8(b).

FIG. 8(a) is a plane view of the example and FIG. 8(b) is the C—C cut cross-sectional view of the example shown in FIG. 8(a).

The chip 6 is provided with reflection means 4 which is made of a magnetically different material from that used to form the YIG film 2, in order to reflect magnetostatic waves before they reach the end portions of the chip 6.

The chip 6 comprises a GGG base substrate 1, a YIG film 2 formed thereon, a center conductor 3, and a Ti-diffused layer 18 as the reflection means.

Figure 9:
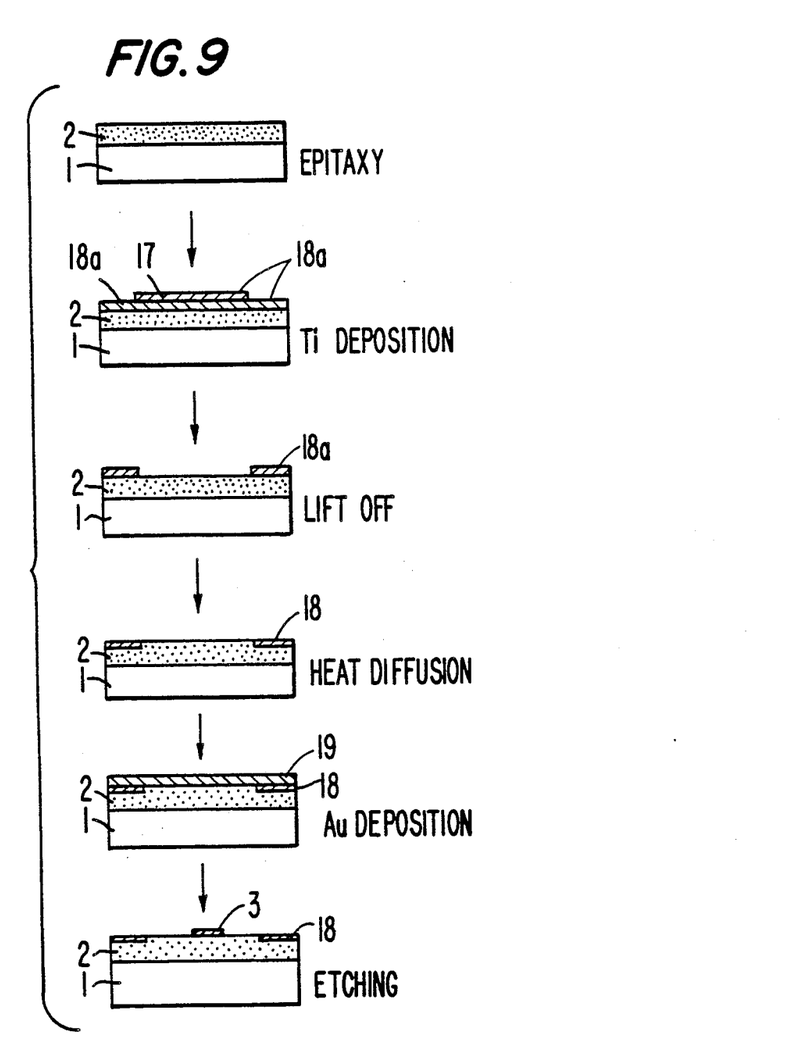
FIG. 9 shows schematically the steps of a process to manufacture a chip as shown in FIG. 8 which is incorporated with a Ti-diffused layer 4 as reflection means on the YIG film.

The chip for magnetostatic wave device shown in FIG. 8 can be produced by the steps shown schematically, namely in FIG. 9;

(a) forming a 20 μm thickness of YIG film 2 by liquid phase epitaxy(LPE) on a 5 mm×5 mm square shape of GGG base substrate 1;

(b) forming a resist layer 17 on the YIG film 2;

(c) taking off unnecessary portion of the resist layer 17 by photo-etching technology;

(d) depositing Ti layer on the upper surface of the chip;

(e) lifting off a 3 mm diameter of center portion of Ti film together with the resist to leave the peripheral portion 18a of Ti film on the chip;

(f) diffusing Ti into the YIG film 2 by heating to make the Ti-diffused layer 18;

(g) forming a 30 μm width(w) of center conductor 3 and input/output terminals 3a, 3b to produce the chip 6 as shown in FIG. 8(a) by using photolithographic technology, after depositing and then removing selected portions of an Au layer 19 on the upper surface of the chip.

After the step (f), the Ti-diffused layer 18 has a higher magnetic anisotropy than the other parts of the YIG film 2 where Ti is not diffused. In this manner, the peripheral area of the YIG film can be changed to provide reflection means for magnetostatic waves.

To evaluate the characteristics of the chip 6 for magnetostatic wave device, a scattering parameter $S_{21}$ was measured under the condition as shown in FIG. 8(b) where the terminal 3a and the ground 5 are input terminals and the terminal 3b and the ground 5 are output terminals while the chip 6 is located on the ground 5 in a magnetic field $H_0$ equal to 2600 Oe as in Example 1.

Figure 10:
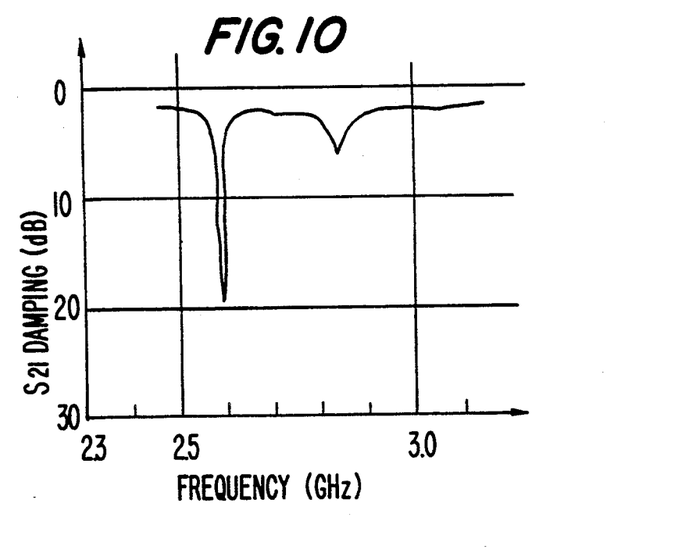
FIG. 10 is a graph to show frequency dependency of resonance characteristics in the chip shown in FIG. 8.

The results of the measurement are shown in FIG. 10.

As the results of Example 1 shown in FIG. 4(a), a sharp shape of main resonance $f_R$ at a frequency of 2.60 GHz is observed and the load $Q_L$ is equal to 900.

Another resonance is observed around at a frequency of about 2.85 GHz which corresponds to a higher mode, but the height is significantly smaller than the height of a main peak.

As is apparent from the comparison of the example of the invention with the device which is not provided with the reflection means which results in the resonance characteristic shown in FIG. 4(b), it is understood that an extremely high Q-value of device can be produced according to the invention.

EXAMPLE 4

Figure 11:
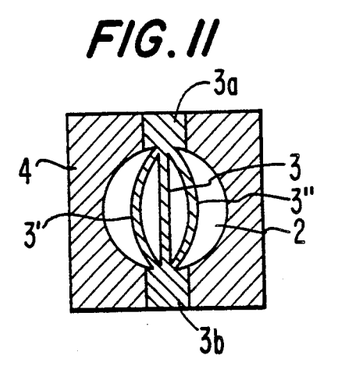

In FIG. 11, another example of a chip according to the invention is shown. The reflection means located at the peripheral area of the YIG film has magnetically different characteristics compared to the remainder of the YIG film. The chip is provided with three center conductors 3, 3' and 3".

Higher modes of resonances are suppressed, because of the control of the distribution of the high frequency magnetic field in the YIG film 2.

EXAMPLE 5

Figure 12A:
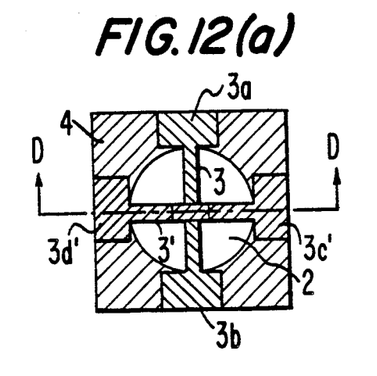
Figure 12B:
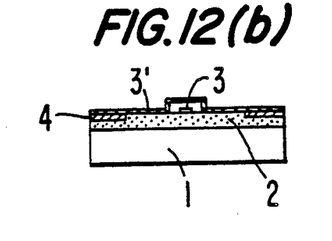
FIG. 12(b) and FIG. 12(d) are respectively the D—D cut cross-sectional views of the chip shown in FIG. 12(a) and the E—E cut cross-sectional view of the chip shown in FIG. 12(c)
Figure 12C:
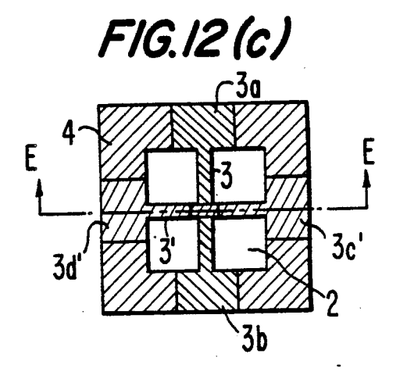

Other examples of construction of center conductors are shown in FIG. 12(a) and FIG. 12(c).

FIG. 12(a) is a plane view of a chip which is provided with one more center conductor 3' crossing the center conductor 3 on a chip constructed as in Example 3.

FIG. 12(c) is a plane view of a chip having a similar structure to the chip shown in FIG. 12(a).

Figure 12D:
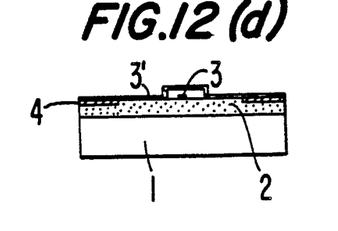

FIG. 12(b) and FIG. 12(d) are respectively the D—D cut cross-sectional view of the chip shown in FIG. 12(a) and the E—E cut cross-sectional view of the chip shown in FIG. 12(c).

In these examples, two center conductors cross at the center in the upper surface of the chip, but the two conductors are insulated from each other by bridge means at the center.

A high Q-value of band-pass filter is produced when 3a, 3b are used as a pair of input terminals and 3'c, 3'd are used as a pair of output terminals.

EXAMPLE 6

Figure 13A:
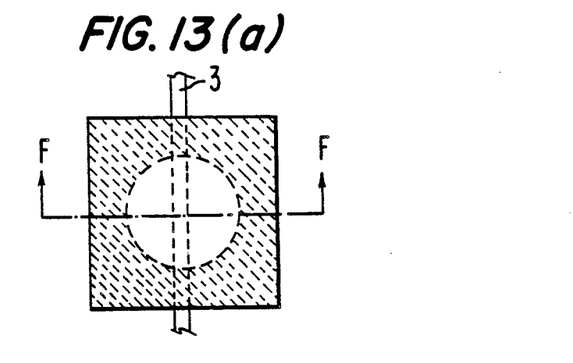
FIG. 13 is the F—F cut cross-sectional view of the chip shown in FIG. 13(a)
Figure 13B:
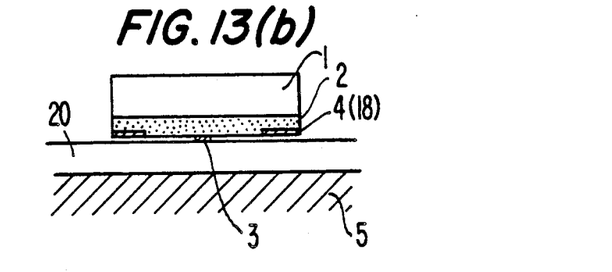

Another example of a chip made in accordance with the present invention is shown in FIG. 13(a) and FIG. 13(b). FIG. 13(a) is a plane view of the chip and FIG. 13(b) is the E—E cut cross-sectional view of the chip shown in FIG. 13(a).

The chip 6 is provided with a Ti diffused layer 18 as reflection means for magnetostatic waves as in Example 3.

The chip is located on a center conductor 3 of microstrip line 20 as shown in FIG. 13(a) and FIG. 13(b).

The chip 6 itself does not include a center conductor.

The YIG film 2 on the chip plays a role as magnetostatic resonance means.

It is not necessary to contact chip 6 with the center conductor 3, and locating them adjacent one another is sufficient.

Other processes can be employed to form a material with a by magnetically different character in the ferrimagnetic layer. For example injection of other elements in the peripheral area of a YIG film can be accomplished by ion injection, an oxidation-reduction process, or by other processes.

Figure 14A:
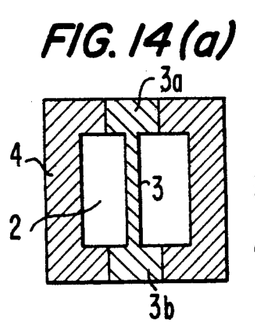
FIG. 14(a), FIG. 14(b) and FIG. 14(c) are respectively plane views of other types of chip for magnetostatic wave device according to the invention.
Figure 14B:
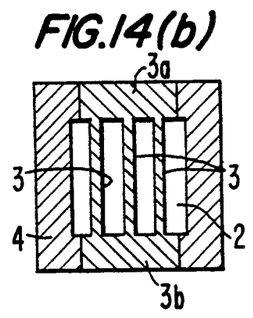
Figure 14C:
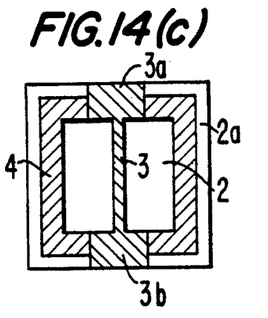

Other examples of a chip according to the present invention are shown in FIG. 14(a), FIG. 14(b) and FIG. 14(c).

In these examples terminals 3a, 3b are formed on both ends of a center conductor (in FIG. 14(a) and FIG. 14(c)) or three center conductors (FIG. 14(c)) are formed at about the center of a ferrimagnetic film 1 surrounded by peripheral reflection parts 4.

In these examples each of input or output terminals 3a, 3b has a wide width, which makes connection of the chip with other elements easy and firm.

A magnetostatic wave device having excellent preformance characteristics is produced according to the present invention. The device is provided with suppression of undesirable higher frequencies of excitation, high accuracy of chip dimensions, easy interpretation of the chip with other circuit elements, and high productivity in terms of being able to mass produce the chip.

We claim:
1. A chip for magnetostatic wave device comprising;
   a base substrate consisting of a flat dielectric monocrystalline base plate and a ferrimagnetic monocrystalline film formed on the base plate, said ferrimagnetic film having essentially constant thickness within a given planar area surrounding a film center portion and having edge portions spaced from said center portion;
   excitation means at least closely adjacent said center portion for generating magnetostatic waves in the ferrimagnetic film when a bias magnetic field is applied to the chip and high frequency electric signals are applied to said excitation means; and
   reflection means disposed on said planar area and substantially surrounding said center portion for reflecting the generated magnetostatic wave toward the center portion of the film before it reaches the edge portions of the ferrimagnetic film.
2. The chip for a magnetostatic wave device as set forth in claim 1, wherein said reflection means comprise an electrically conductive film formed on the peripheral portion of the ferrimagnetic film planar area.
3. The chip for a magnetostatic wave device as set forth in claim 2, wherein said electrically conductive film has a circular inner edge.
4. The chip for a magnetostatic wave device as set forth in claim 1, wherein said reflection means comprise a surface layer formed in said ferrimagnetic film, said surface layer comprising a magnetically different material from the material making up the remainder of said ferrimagnetic film, and wherein said surface layer is formed in peripheral portion of the ferrimagnetic film planar area.
5. The chip for a magnetostatic wave device as set forth in claim 1, wherein said excitation means for generating magnetostatic waves comprise at least one electrically conductive strip for passing high frequency current therethrough.
6. The chip for a magnetostatic wave device as in claim 5 wherein three spaced, non-overlapping electrically conductive strips are provided for said excitation means, said three strips being electrically interconnected at their respective ends.
7. The chip for a magnetostatic wave device as in claim 5 wherein at least two electrically conductive strips are provided, for excitation means said two strips having respective portions oriented to overlap one another at about said chip center portion, said overlapped portions being conductively isolated from one another.
8. The chip for a magnetostatic wave device as in claim 5 wherein said electrically conductive strip of said excitation means is formed directly on said ferrimagnetic film, and wherein at least one end of said electrically conductive strip extends outwardly past said reflection means, relative to said film center portion.
9. A magnetostatic wave device comprising:
   a chip having
   (a) a base substrate consisting of a flat dielectric monocrystalline base plate and a ferrimagnetic monocrystalline film formed on the base plate, said ferrimagnetic film having essentially constant thickness within a given planar area surrounding a film center portion and having edge portions spaced from said center portion;
   (b) excitation means at least closely adjacent said center portion for generating magnetostatic waves in the ferrimagnetic film when a bias magnetic field is applied to the chip and high frequency electric signals are applied to said excitation means;

(c) reflection means disposed on said planar area and substantially surrounding said center portion for reflecting the generated magnetostatic wave toward the center portion of the film before it reaches the edge portions of the ferrimagnetic film;

(d) magnetic field generating means operatively disposed to provide a bias magnetic field to said chip; and (e) terminal means for providing electrical signals to be inputted and outputted from said device.

10. The magnetostatic device as set forth in claim 9 wherein said magnetic field generating means includes at least one permanent magnet.

11. The magnetostatic device as set forth in claim 10 wherein said magnetic field generating means further includes magnetic field controlling means.

12. A chip for a magnetostatic wave device comprising:

a base substrate consisting of a dielectric monocrystalline base plate;

a ferrimagnetic monocrystalline film formed on the base plate;

an electrically conductive reflection means which defines a film center portion on the ferrimagnetic film; and an excitation means to generate a magnetostatic wave located at the film center portion on the ferrimagnetic film, wherein said reflection means serve to reflect the generated magnetostatic wave toward the film center portion before it reaches edge portions of the ferrimagnetic film.

13. A magnetostatic wave device comprising:

(a) a chip having a base substrate consisting of a dielectric monocrystalline base plate, a ferrimagnetic monocrystalline film formed on the base plate, an electrically conductive reflection means which defines a film center portion on the ferrimagnetic film, and an excitation means to generate a magnetostatic wave located at the film center portion on the ferrimagnetic film, wherein said reflection means serve to reflect the generated magnetostatic wave toward the film center portion before it reaches edge portions of the ferrimagnetic film;

(b) a magnetic field generating means for the chip; and (c) terminal means for providing electrical signals to be inputted and outputted from the device.

* * * * *

UNITED STATES PATENT AND TRADEMARK OFFICE
CERTIFICATE OF CORRECTION

PATENT NO. : 4,992,760

DATED : February 12, 1991

INVENTOR(S) : TAKEDA ET AL.

It is certified that error appears in the above-identified patent and that said Letters Patent is hereby corrected as shown below:

Claim 7, column 8, line 47, change "provided, for excitation means" to --provided for said excitation means--.

Signed and Sealed this

Fourteenth Day of July, 1992

*Attest:*

DOUGLAS B. COMER

*Attesting Officer*      *Acting Commissioner of Patents and Trademarks*